(12) United States Patent
Lahr

(10) Patent No.: US 9,197,226 B2
(45) Date of Patent: Nov. 24, 2015

(54) DIGITAL PHASE DETECTOR

(71) Applicant: ANALOG DEVICES, INC., Norwood, MA (US)

(72) Inventor: Lewis F. Lahr, Dover, MA (US)

(73) Assignee: Analog Devices, Inc., Norwood, MA (US)

( * ) Notice: Subject to any disclaimer, the term of this patent is extended or adjusted under 35 U.S.C. 154(b) by 119 days.

(21) Appl. No.: 14/132,635

(22) Filed: Dec. 18, 2013

(65) Prior Publication Data

US 2015/0008960 A1    Jan. 8, 2015

Related U.S. Application Data

(60) Provisional application No. 61/843,896, filed on Jul. 8, 2013.

(51) Int. Cl.
*H03L 7/085* (2006.01)
*H03L 7/095* (2006.01)

(52) U.S. Cl.
CPC .............. *H03L 7/095* (2013.01); *H03L 7/085* (2013.01)

(58) Field of Classification Search
USPC ......... 327/3, 5, 7–10, 12, 147, 150, 156, 159; 331/25; 375/373, 376
See application file for complete search history.

(56) References Cited

U.S. PATENT DOCUMENTS

| 6,326,851 B1 * | 12/2001 | Staszewski et al. ............. 331/17 |
| 7,567,642 B2 * | 7/2009 | White ............................ 375/376 |
| 2013/0077724 A1 | 3/2013 | Dreps et al. | |

FOREIGN PATENT DOCUMENTS

| EP | 0428869 B1 | 5/1991 |
| EP | 1844542 B1 | 10/2007 |

* cited by examiner

*Primary Examiner* — Patrick O'Neill

(57) ABSTRACT

According to one example, a digital phase detector is disclosed for use with a phase lock loop. The digital phase detector is configured to operate in a low-frequency environment and to filter noise and transients in a signal, while also being tolerant of dropped phase pulses. In some embodiments, the digital phase detector is configured to measure up to two REFCLK edges with respect to a FBCLK signal, and if an edge occurs in the first half of REFCLK, classify the edge as lagging, and if an edge occurs in the second half of REFCLK, classify the edge as leading. If both edges are leading or both are lagging, the smaller of the two is used as the phase. If one is leading and one is lagging, the difference is used as the phase.

26 Claims, 5 Drawing Sheets

DIGITAL PHASE DETECTOR

PRIORITY DATA

This application claims the benefit of priority under 35 U.S.C. §119(e) to U.S. Provisional Application Ser. No. 61/843,896, entitled "Digital Phase Detector" filed Jul. 17, 2013, which disclosure is considered part of and is hereby incorporated by reference in the disclosure of this Application.

FIELD OF THE DISCLOSURE

This application relates to the field of digital timing and, more particularly, to a digital phase detector.

BACKGROUND

Phase detectors can be used in timing and synchronization circuits and, in particular, in phase-locked loops. A phase detector can receive two variable signals such as sine waves as inputs and, subsequently, calculate a phase difference between them.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY OF EXAMPLE EMBODIMENTS

Figure 1:
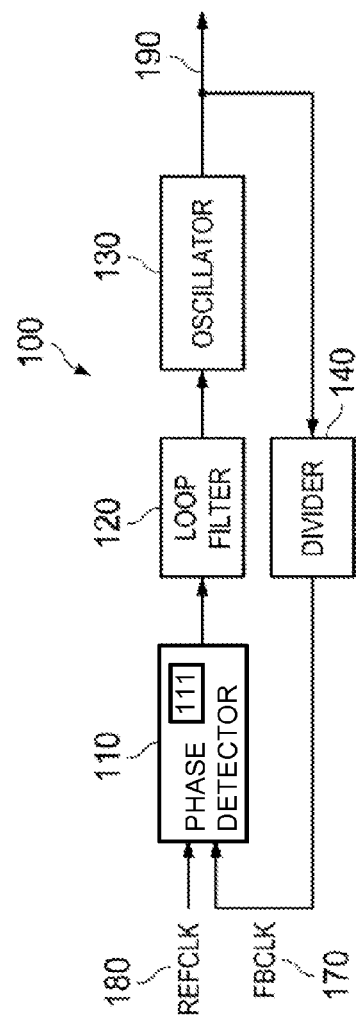
FIG. 1 is a block diagram of a phase lock loop according to one or more example embodiments of the present specification.

In an example, there is disclosed a method of phase locking a loop with minimal lock losses, comprising searching for a REFCLK signal edge with respect to a period of a FBCLK signal, wherein the REFCLK signal edge is a reference clock signal input and the FBCLK signal is a feedback clock signal; if a REFCLK signal edge is found, classifying the FBCLK signal as lagging if the REFCLK edge occurs within a first half of the period of the FBCLK signal; and classifying the FBCLK signal as leading if the REFCLK signal edge occurs within a second half of the period of the FBCLK signal.

In another example, there is disclosed a phase detector for use in a phase lock loop, the phase detector operable to phase lock the loop with minimal lock losses, the phase detector comprising circuitry configured to search for a REFCLK signal edge with respect to a period of a FBCLK signal, wherein the REFCLK signal edge is a reference clock signal input and the FBCLK signal is a feedback clock signal; if a REFCLK signal edge is found, classify the FBCLK signal as lagging if the REFCLK edge occurs within a first half of the period of the FBCLK signal; and classify the FBCLK signal as leading if the REFCLK signal edge occurs within a second half of the period of the FBCLK signal.

In yet another example, there is disclosed A phase lock loop, comprising a phase detector configured to receive a REFCLK signal input and a FBCLK signal input and provide a PHASE signal as an output; a phase conditioner configured to receive the PHASE signal from the phase detector and to output a CONDITIONED_PHASE signal; a digital loop filter configured to receive the CONDITIONED_PHASE signal from the phase conditioner, filter out high-frequency components of the CONDITIONED_PHASE signal, and provide a filtered CONDITIONED_PHASE signal as an output; a digitally-controlled oscillator configured to receive the filtered CONDITIONED_PHASE signal and to provide a final output CLK signal with correct phase and frequency; and a divider configured to receive the CLK signal and provide the FBCLK signal to the phase detector in a feedback configuration as a rational multiplier of the REFCLK signal, and to output a COUNT signal corresponding to a phase count; wherein the phase detector is further configured to search for a REFCLK signal edge with respect to a period of the FBCLK signal, wherein the REFCLK signal edge is a reference clock signal input and the FBCLK signal is a feedback clock signal; if a REFCLK signal edge is found, classify the FBCLK signal as lagging if the REFCLK edge occurs within a first half of the period of the FBCLK signal; and classify the FBCLK signal as leading if the REFCLK signal edge occurs within a second half of the period of the FBCLK signal.

DETAILED DESCRIPTION OF EXAMPLE EMBODIMENTS

The digital phase detector of the present disclosure may be used in a circuit for information and audio data to be transmitted bidirectionally using a twisted wire pair to connect a series of nodes to each other. A plurality of slave nodes may be powered by the same twisted wire pair. In some embodiments, the wire is unshielded, and it is therefore important for the system to work well in a noisy environment and to minimize EM emissions.

One embodiment of a 'type 4' phase/frequency detector accepts missing and spurious reference clocks as valid stimuli and causes the PLL to add or drop reference clock periods. This causes the PLL to lose lock for numerous reference clock periods, which can cause a slave node and all downstream slave nodes to drop out of the system.

Furthermore, certain Hogge phase detectors (often used in data recovery PLLs) can tolerate missing reference clocks. However, at low clock frequency (44-48 kHz), this may be impractical. When in phase lock, Hogge detectors provide a half cycle pump up pulse, followed by a half cycle pump down pulse. This constant input to the PLL may case excessive jitter on the output clocks of the loop.

In an example of the disclosure of the present specification, a digital phase detector is disclosed for use with a phase lock loop. The digital phase detector is configured to operate in a low-frequency environment and to filter noise and transients in a signal, while also being tolerant of dropped phase pulses. In some embodiments, the digital phase detector is configured to measure up to two REFCLK edges with respect to a FBCLK signal, and if an edge occurs in the first half of REFCLK, classify the edge as lagging, and if an edge occurs in the second half of REFCLK, classify the edge as leading. If both edges are leading or both are lagging, the smaller of the two is used as the phase. If one is leading and one is lagging, the difference is used as the phase.

FIG. 1 is a block diagram of an example phase lock loop (PLL) 100. PLL 100 receives as inputs a reference clock REFCLK 180, and a feedback clock FBCLK 170. PLL 100 receives as inputs a reference clock REFCLK 180, and a feedback clock FBCLK 170. PLL 100 includes a phase detector 110, a loop filter 120, an oscillator 130, and a divider 140. An output clock signal CLKOUT 190 is the output. The phase detector 110 includes circuitry 111 configured to render the phase detector 110 able to phase lock the PLL 100 with reduced lock losses, as disclosed herein.

Phase detector 110 is provided to compare FBCLK 170 to REFCLK 180 and to detect differences in phase and frequency. Loop filter 120 receives an output signal from phase detector 110 and filters out unwanted noise. In some embodiments, loop filter 120 may be a low pass filter. Oscillator 130 drives output clock signal 190 based on the filtered signal received from loop filter 120. Output signal 190 may be fed back to divider 140, which may be used to ensure that FBCLK 170 is a rational multiple of REFCLK 180. Certain aspects of a PLL of the architecture disclosed in FIG. 1 may be known in the prior art.

Figure 2:
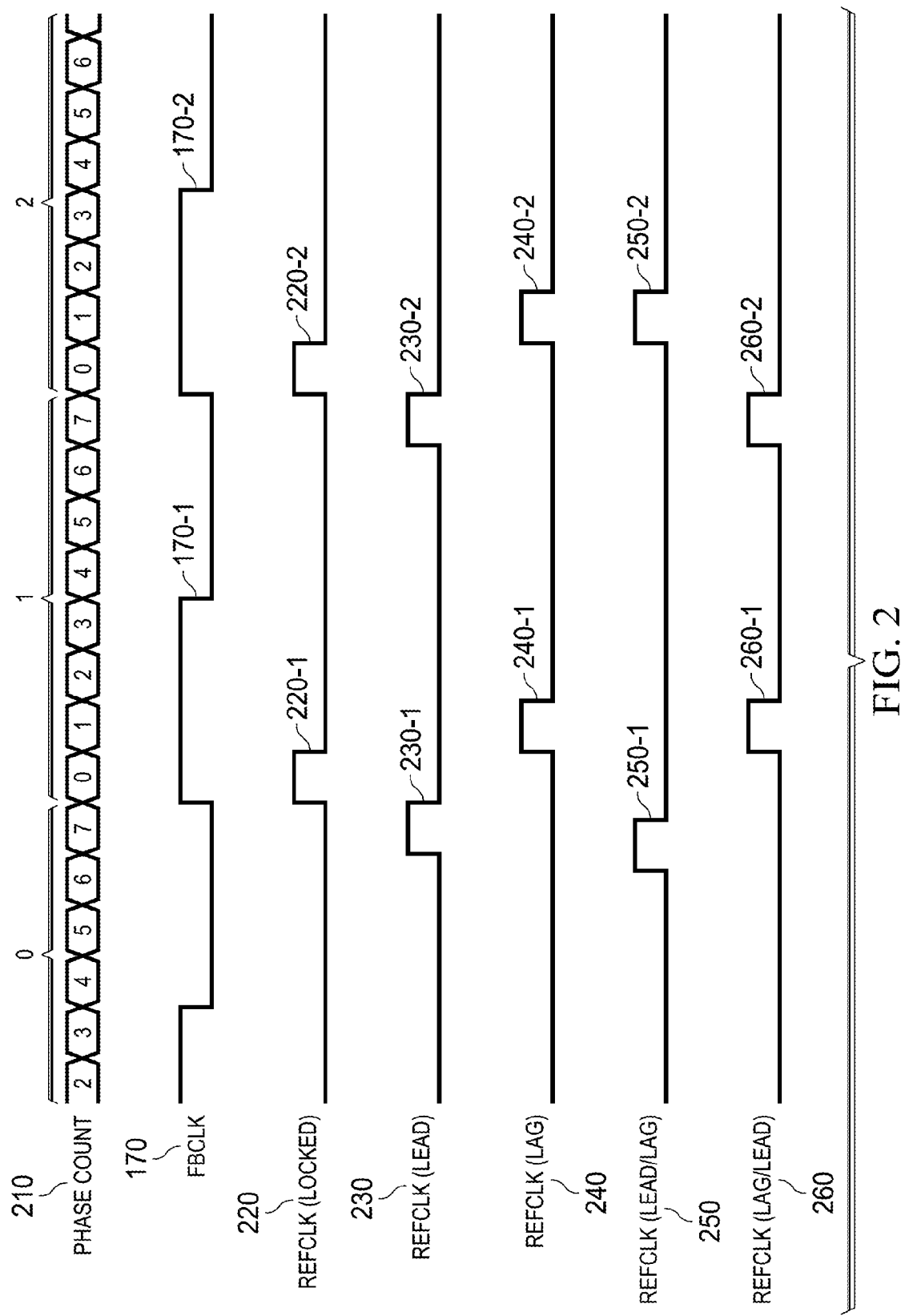
FIG. 2 is a timing diagram disclosing phase locking according to one or more example embodiments of the present specification.

According to one aspect of the present disclosure, a PLL 100 characterizes FBCLK 170 as leading, lagging, lead/lag, or lag/lead with respect to REFCLK 180. FIG. 2 is a timing diagram of a FBCLK signal being compared to a plurality of different REFCLK signals 220, 230, 240, 250, 260. Timing is shown by a series of phase counts 210, which for ease of reference have been divided into groups 0, 1, and 2.

FBCLK 170 includes two clock pulses 170-1, 170-2. Each has a rising edge and a falling edge. For purposes of this example embodiment, only the rising edge is of interest. When FBCLK 170 is properly locked to REFCLK 180, each rising edge of FBCLK 170 matches the rising edge of each pulse of REFCLK 180. In this example, no effort is made to match falling edges, as the digital phase detector of the present example is concerned only with matching phase, not pulse width. In this example, REFCLK pulses have the same length as phase counts 210.

REFCLK 220 is an example of a locked REFCLK. REFCLK 220 has two pulses, 220-1 and 220-2. The rising edge of pulse 170-1 substantially matches the rising edge of pulse 220-1, both occurring at the beginning of pulse 1-0. Pulse 220-2 occurs at the beginning of phase count 1-7, while pulse 220-2 occurs at the beginning of phase count 2-0. In this case, the pulses match when they are sampled at the beginning of phase count 1-7, and they match again when the pulses are sampled at the beginning of phase count 2-0. Thus, the pulses are considered to be properly locked, and will remain so unless and until pulse 170-2 drifts far enough that it samples different from pulse 220-2 at the beginning of a phase count 210.

REFCLK 230 is an example of a leading REFCLK. REFCLK 230 has two pulses 230-1 and 230-2. Pulse 230-1 is sampled high at the beginning of phase count 0-7, while pulse 170-1 is sampled low. At the beginning of phase count 1-0, pulse 170-1 has now gone high (again, the falling edge of pulse 230-1 is not of interest). Similarly, at phase count 1-7, pulse 230-2 is high while pulse 170-2 is low, and at phase count 2-0, pulse 170-2 has gone high. In this case, FBLCLK 170 is said to be leading REFCLK 230 because graphically, FBCLK 170 is "in front" of REFCLK 230. A negative phase angle may be applied to bring FBCLK 170 into phase with REFCLK 230.

REFCLK 240 is an example of a lagging REFCLK. REFCLK 240 has two pulses 240-1 and 240-2. Pulse 170-1 is sampled high at phase count 1-0, while pulse 240-1 is still low. At phase count 1-1, pulse 240-1 now samples high. Similarly, at phase count 2-0, pulse 170-2 samples high while pulse 240-2 samples low. At phase count 2-1, pulse 240-2 now samples high. In this case, both pulses of FBCLK 170 are lagging both pulses of REFCLK 240. A positive phase angle may be applied to bring FBCLK 170 into phase with REFCLK 240.

REFCLK 250 is an example of a lead/lag REFCLK. REFCLK 250 has two pulses, 250-1 and 250-2. Pulse 250-1 is sampled high at phase count 0-7, while pulse 170-1 is sampled low. At phase count 1-0, pulse 170-1 has gone high. In this case, pulse 170-1 is leading pulse 250-1. However, at phase count 2-0, pulse 170-2 is high while pulse 250-2 is low. In this case, pulse 170-2 is lagging pulse 250-2. Thus, FBCLK 170 is in a lead/lag configuration with respect to REFCLK 250. To correct the lead/lag configuration, phase detector 310 may accept the smaller (pulse 250-1) and reject the larger (pulse 250-2).

REFCLK 260 is an example of a lag/lead REFCLK. REFCLK 260 has two pulses, 260-1 and 260-2. At phase count 1-0, pulse 170-1 is high while pulse 260-1 is low. At phase count 1-1, pulse 260-1 has gone high. Thus, in this case, pulse 170-1 is lagging pulse 260-1. However, at phase count 1-7, pulse 260-2 is high while pulse 170-2 is low. At count 2-1, pulse 170-2 has gone high. In this case, pulse 170-2 is leading pulse 260-2. Thus, FBCLK 170 is in a lag/lead configuration with respect to REFCLK 260. In this case, the difference of the two phases is applied. A similar case occurs when no valid edges are detected in a FBCLK period. In that case, no phase is measured.

According to one embodiment of the present disclosure, a PLL performs an initial phase and frequency lock using a 'type 4' phase/frequency detector and then transitions to the phase detector described in FIG. 1 and FIG. 2. In one embodiment, a phase detector uses a 'Time to Digital Converter' to measure the phase of up to 2 REFCLK edges with respect to FBCLK. If an edge occurs in the first half of the REFCLK cycle, the edge is classified as lagging REFCLK. If an edge occurs in the second half of the REFCLK cycle, it is classified as leading REFCLK. If both edges are classified as leading or lagging, the edge with the largest phase is rejected and the smaller phase is applied to the loop. If there is both a leading and lagging edge, the difference of the phase information is provided to the loop. Missing edges provide no stimulus to the loop.

Figure 3:
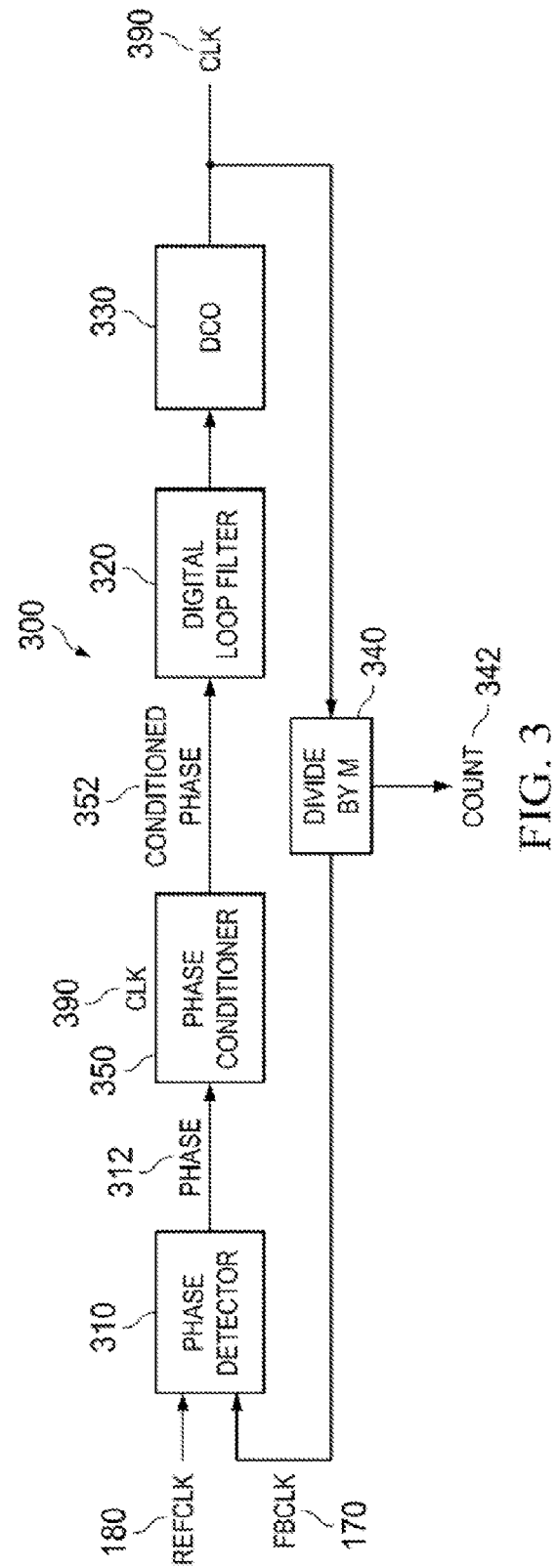
FIG. 3 is a block diagram of a phase lock loop according to one or more example embodiments of the present specification.

FIG. 3 is a block diagram of an example improved PLL 300 in accordance with the present disclosure. Like PLL 100, PLL 300 receives REFCLK 180 and FBCLK 170 as inputs and produces CLK 390 as an output. PLL 300 includes a phase detector 310, phase conditioner 350, digital loop filter 320, digitally controlled oscillator (DCO) 330, and divider 340.

Phase detector 310 is configured to measure phase differences directly in terms of phase counts, as shown in FIG. 3. Phase detector 310 may output a phase difference signal, called phase 312 for simplicity. Phase conditioner 350 is configured to receive phase 312 and in response to phase 312, may make adjustments to CLK 390. Phase conditioner 350 looks at the phase and makes decisions based on statistics. For example:

a. If PHASE>MAG then PHASE=0 (reject)

b. If PHASE is very different from the average PHASE over last N cycles, reject.

c. If average PHASE>threshold, increase bandwidth to improve tracking.

Phase conditioner 350 outputs conditioned phase 352.

Digital loop filter 320 receives phase1 352 and acts as a low-pass filter. DCO 330 receives the filtered signal and is configured to provide an oscillator providing CLK 390 with the correct phase and frequency. CLK 390 also feeds back to divider 340, which may be configured to provide FBCLK 170 as a rational multiplier of REFCLK 180. Divider 340 also outputs count 342, which corresponds to phase count 210 of FIG. 2, and is used as the basis for computing phases.

Figure 4:
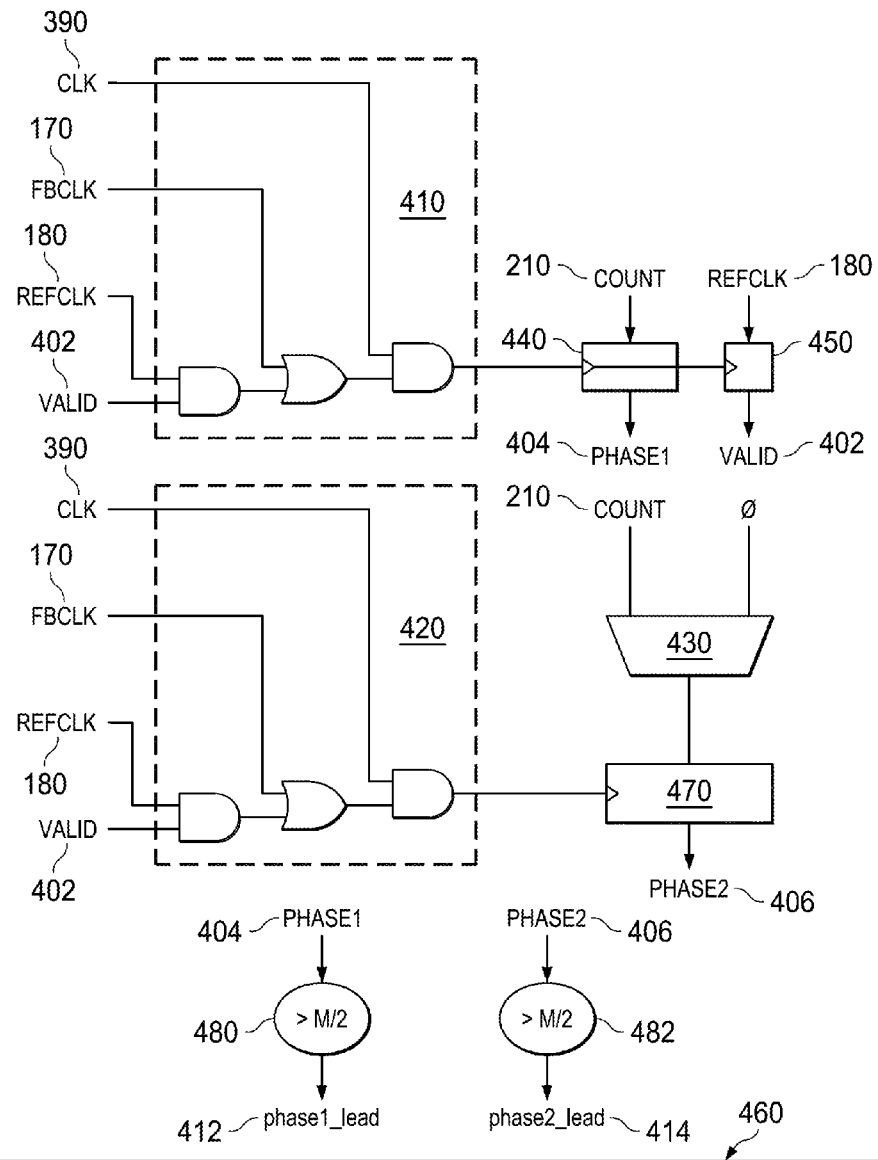
FIG. 4 is a block diagram of a phase detector according to one or more example embodiments of the present specification.

FIG. 4 is a logic-level diagram of certain functions that may be included within phase detector 310. In an example embodiment, phase detector 310 includes a first logic network 410 and a second logic network 420. First logic network 410 receives CLK 390, FBCLK 170, REFCLK 180, and a valid bit 402 as inputs. First network 410 is clocked only when VALID 402 is 0. FBCLK sets register 440 (PHASE) to 0 and sets register 450 (VALID) if REFCLK 180 is present. REFCLK 180 enables register 440 to capture the current phase count. REFCLK 180 should not change on same CLK as FBCLK. It also sets register 450. The output of logic circuit 410 is phase1 404.

Second logic circuit 420 is similar to first logic circuit 410, except that this network is clocked only if VALID 402 is 1. Count 210 is provided to register 470 by multiplexer 430. Multiplexer 430 may alternately initialize register 470 to zero. The output of logic circuit 420 is phase2 406.

Integer value phase1 404 is compared to M/2, which represents the phase of ½ of a FBCLK period. Edges in the first half are classified as lagging, and edges in the second half are classified as leading. In the example of FIG. 2, M=8. The result of the comparison is Boolean flag phase1_lead 412, indicating whether FBCLK 170 is leading REFCLK 180 in phase1. Similarly, integer value phase2 406 is compared to M/2, and the result is Boolean flag phase2_lead, indicating whether FBCLK 170 is leading REFCLK 180 in phase2.

Table 460 provides an example logic configuration for responding to the results of Boolean flags 412, 414. If both are 0, then both phase1 404 and phase2 406 are lagging, and the larger phase value (phase2 in this case) is rejected. Phase detector 310 then provides—phase1 as the value for phase 312, which phase conditioner 350 can then use to adjust CLK 390.

If phase2_lead is false and phase1_lead is true, then phase1 is leading and phase2 is the larger phase. In this case, phase2 is rejected, and phase 312 is provided as M-phase1. If phase2_lead is true and phase1_lead is false, then FBCLK 170 is in a lag/lead configuration with respect to REFCLK 180, and phase 312 is provided as M-phase2-phase1. If phase2_lead is true and phase1_lead is true, then both are leading and phase1 is the larger phase. In this case, phase1 is rejected, and phase 312 is provided as M-phase2. In an example, M=2048.

Although not shown in this table, it is also conceivable to have no phase during a given FBCLK cycle. This may happen because, for example, a REFCLK is missing or because a leading REFCLK was followed by a lagging REFCLK. In that case, no phase is measured.

According to an example system-level embodiment of the present disclosure, a system is defined comprising a master node and one or more slave nodes. Since the bus provides transmission in both directions, the protocol is broken up into a downstream time where a control frame and downstream data are transmitted from the master and an upstream time where a response frame and upstream data are transmitted to the master. Each slave node uses the first part of the received control frame as a time base feeding a PLL. Because of this, it is important that the control frame begins with a synchronization pattern that cannot be replicated by any data pattern. The noisy environment may result in missing the timing information from the frame.

In yet other embodiments of the present disclosure, windowing REFCLK is employed to provide additional protection against spurious edges. REFCLK edges that have a phase difference of greater than +/−WINDOW are blocked before entering the phase detector and provide no information to the loop. Additionally, the phase detector output phase 312 can be filtered rejecting phase output of the phase detector that is greater than +/− a given threshold.

In yet another example embodiment, PLL 300 resets itself and attempts to relock if an unacceptable number of FBCLK cycles occur without a REFCLK or if the measured phase is larger than what the system will tolerate. For example, in one embodiment, PLL 300 resets and reclocks itself if more than 8 FBCLKS occur without receiving a REFCLK.

Figure 5:
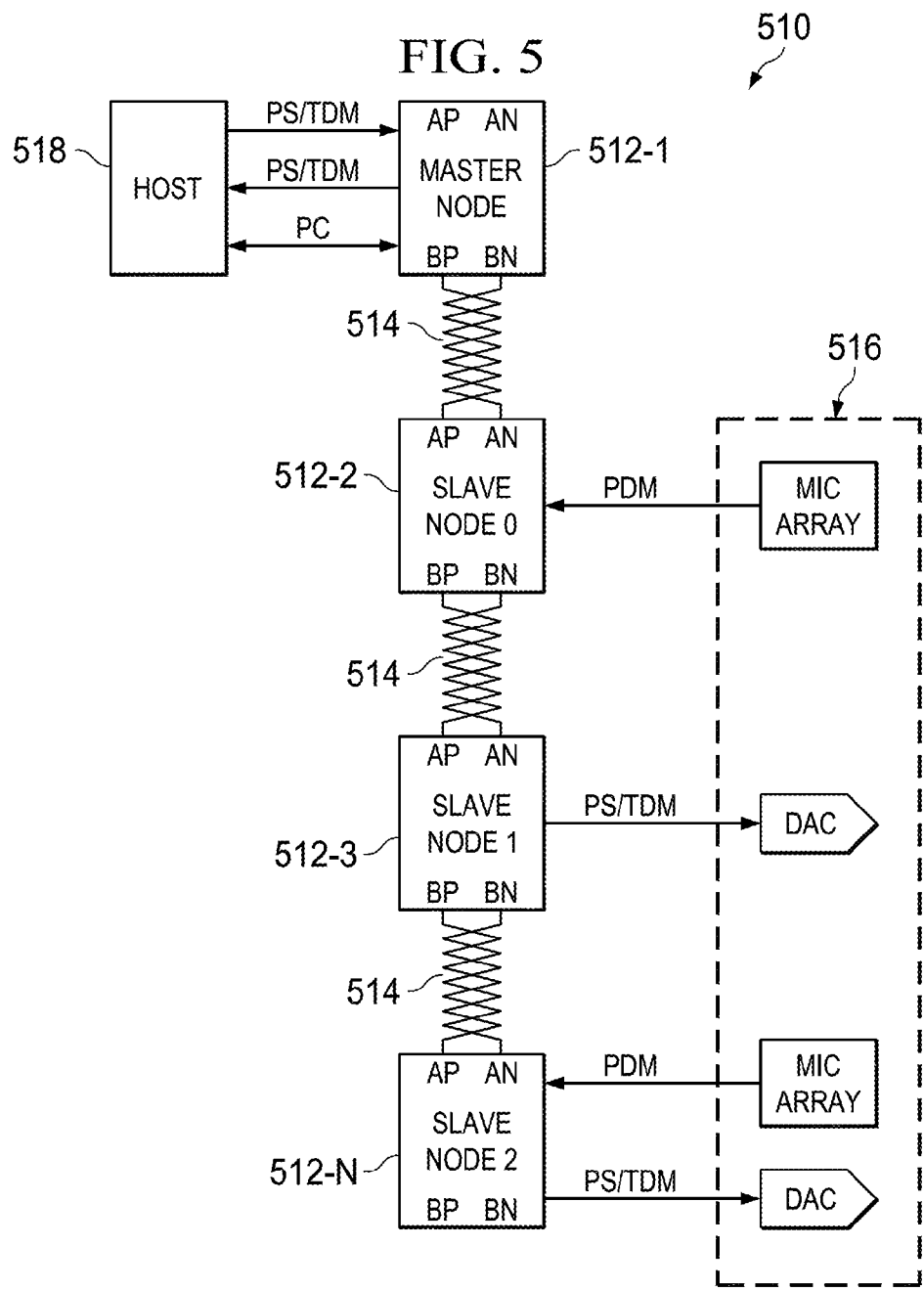
FIG. 5 is a simplified block diagram illustrating a system including a two-wire communication protocol engine according to one or more example embodiments of the present specification.
Figure 6:
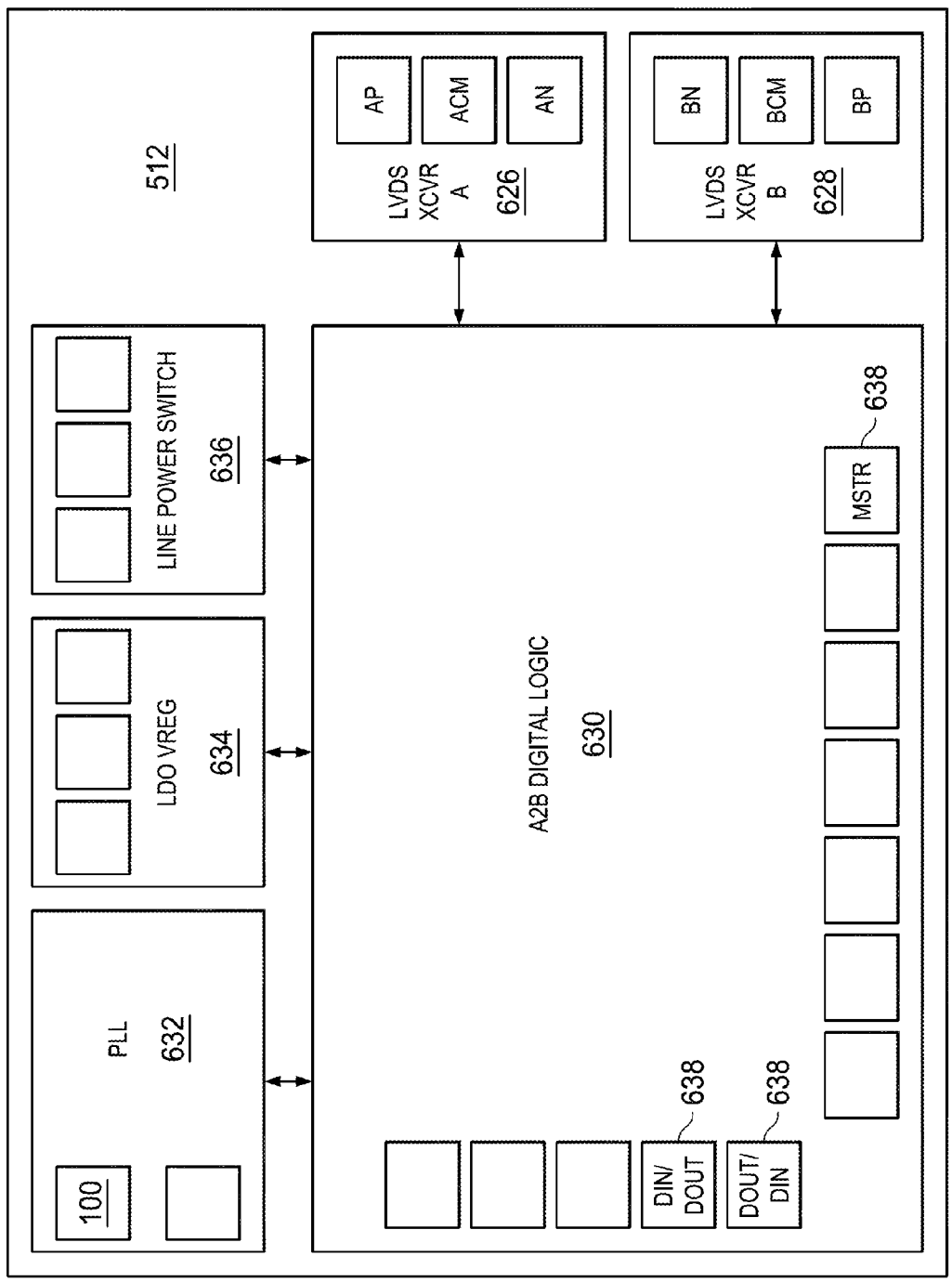
FIG. 6 is a simplified block diagram illustrating an example node according to an embodiment of a system according to one or more example embodiments of the present specification.

FIGS. 5 and 6 illustrate an example embodiment of a PLL according to one or more example implementations of the present specification. FIG. 5 is a simplified block diagram illustrating a system 510 including a two-wire communication protocol engine according to one or more example embodiments of the present specification. System 510 comprises a plurality of nodes 512-1-512-N. 512-1 represents a master node, which communicates with three slave nodes 512-2-512-N over a twisted wire pair bus 514 using a two-wire communication protocol (e.g., $A^2B$ protocol). Each slave node 512-2-512-N may read and/or write data from/to one or more sensors or other peripheral devices 16. Examples of peripheral devices include microphones (mics), mic arrays, digital to analog converters (DACs), etc. A host controller 518 may communicate with and control master node 512-1 over multi-channel $I^2S$ and Inter-Integrated Circuit ($I^2C$) communication protocols. Embodiments of the $A^2B$ protocol engine may allow for control information and audio data to be transmitted in both directions using twisted wire pair bus 14 to connect each node to the next one. Slave nodes 512-2-512-N can also be powered by twisted wire pair 14.

As used herein, the term "node" refers to any integrated circuit, device, or other such object capable of sending and receiving data (e.g., electrical signals) over appropriate communications channels in an electrical circuit. The "master node" comprises an originator of a clock signal (e.g., which can be derived from an $I^2S$ input), downstream data, network control and power; the master node is programmed by host controller 518 (e.g., microprocessor), and it receives/sends payload to/from host controller 518. The "slave node" comprises an addressable network connection point that can represent a possible destination for downstream data frames (e.g., single block of payload of a specific node with possibly multiple synchronous data slots of content) and source of upstream data frames. Synchronous data refers to continuously streamed data (e.g., audio signal) in which a fixed time interval (e.g., 48 kHz) and a fixed phase spaces two corresponding transitions.

In various embodiments, each node 512-1-512-N may include an $A^2B$ protocol engine implemented, for example, in a portion of an integrated circuit. In various embodiments, the $A^2B$ protocol engine manages control and data transmissions in the linear, bi-directional, multi-node bus system. According to various embodiments, the integrated circuit comprising the $A^2B$ protocol engine can work well in a noisy environment, for example, by minimizing electromagnetic emissions. Each protocol engine may include a state machine that allows for synchronized updates of programmed data across system 510, a distributed interrupt system, a synchronization pattern based on data coding used in the two-wire communication protocol, and data scrambling applied to a portion of the data traversing twisted wire pair bus 514. Another feature includes a simplified floating-point compression to compress data before it is transmitted across twisted wire pair bus 514.

In a general sense, the $A^2B$ protocol can connect multi-channel $I^2S$ synchronous, pulse code modulated (PCM) data between nodes 512-1-512-N. The $A^2B$ protocol can also extend the synchronous, time division multiplexed (TDM) nature of $I^2S$ to system 510 that connects multiple nodes 512-1-512-N, where each node 512-1-512-N can consume data, provide data, or both.

According to various embodiments, master node 512-1 may be configured (e.g., programmed, designed, etc.) through an integrated $I^2C$ port. Master node 512-1 may generate downstream $A^2B$ transactions (e.g., data signals, power signals, etc.) and receive upstream $A^2B$ transactions. Data received via twisted wire pair 514 may be written into an $A^2B$ frame buffer and transmitted out of master node 512-1 through two $I^2S$ transmitters. Data to be transmitted via $A^2B$ may be read from the $A^2B$ frame buffer, which may be filled by two $I^2S$ receivers.

In some embodiments, master node 512-1 comprises state machines to manage the $A^2B$ protocol including discovery (e.g., of slave nodes 512-2-512-N), broadcast writes (e.g., of system wide information, configuration changes, etc.), CRC generation of synchronization control frames, cyclic redundancy check (CRC) error detection and handling for synchronization response frames, CRC error detection and handling for interrupt frames, parity generation for downstream data, and parity checks and error handling for upstream data (among other features).

Each slave node 512-2-512-N may be configured through the upstream $A^2B$ port. Each slave node 512-2-512-N may receive downstream $A^2B$ transactions and optionally retransmit the transactions further downstream. Each slave node 512-2-512-N may either receive or generate upstream $A^2B$ transactions, optionally retransmit data upstream, and optionally add data to the upstream transaction. Data received via $A^2B$ may be written into the $A^2B$ frame buffer and transmitted out through two $I^2S$ transmitters. Data to be transmitted via $A^2B$ may be read from the $A^2B$ frame buffer, which may be filled by two $I^2S$ receivers and/or by a PDM interface. Each slave node 512-2-512-N may comprise corresponding state machines to manage $A^2B$ protocol, similar to the state machine on master node 512-2. The $I^2C$ Interface of each slave node 512-2-512-N may be used as a master to control attached nodes. Commands may be sent from host controller 518 over twisted wire pair bus 514 and passed to a slave node through the $I^2C$ Interface. The $A^2B$ protocol can comprise a single-master, multiple-slave system where master node 512-1 is controlled by host controller 518. Host controller 518 can generate a periodic synchronization signal on its $I^2S$ TDM interface at a fixed frequency (e.g., 48 kHz) to which all $A^2B$ nodes 512-1-512-N may synchronize.

During operation, when system 510 is communicating data between various nodes 512-2-512-N, each node may be configured to handle data on twisted wire pair bus 514. Communications along $A^2B$ twisted wire pair bus 514 occurs in periodic superframes. Each superframe is divided into periods of downstream transmission (also called downstream portions), upstream transmission (also called upstream portions), and no transmission (where the bus is not driven). For example, master node 512-1 may be programmed with a number of downstream portions to transmit to slave nodes 512-2-512-N, and a number of upstream portions to receive from slave nodes 512-2-512-N. Slave nodes 512-2-512-N may be programmed with a number of downstream portions to retransmit down $A^2B$ twisted wire pair bus 514, a number of downstream portions to consume, a number of upstream portions to retransmit up $A^2B$ twisted wire pair bus 514, and a number of upstream portions to transmit received data from corresponding peripheral devices 516.

It may be noted that although only four nodes 512-1-512-N are shown herein for sake of simplicity, any number of nodes may be interconnected in a similar manner within the broad scope of the embodiments of system 510. Moreover, each slave node 512-2-512-N may communicate with any number of peripheral devices within the broad scope of the embodiments.

FIG. 6 is a simplified block diagram illustrating an example node 512 according to one or more example embodiments of the present specification. Node 512 can include two Low Voltage Differential Signaling (LVDS) transceivers (XCVRs), namely, LVDS XCVR 626 and LVDS XCVR 628. Each LVDS transceiver 626 and 628 has a positive pad (P) and a negative pad (N). The positive pad (e.g., AP) of one transceiver on one node connects to another positive pad (e.g., BP) on another transceiver on another node. Likewise, the negative pad (e.g., AN) of one transceiver on one node connects to another negative pad (e.g., BN) on another transceiver on another node. An A2B digital logic module 630 may communicate (e.g., through electronic signals) with a phased locked loop (PLL) 632, a low dropout regulator (LDO) 634 and a line power switch 636 (among other components). Various digital pads (e.g., pins) 638 may carry signals in and out of node 512.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.'

Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, loop filters, oscillators, phase detectors, phase conditioners, capacitors, buffers, graphics elements, interconnect boards, clocks, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the digital phase detector discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The present disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments many have different advantages, and no particular advantage is necessarily required of any embodiment.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A method of phase locking a loop with minimal lock losses, comprising:
    searching for a reference clock signal edge with respect to a period of a feedback clock signal; and
    if a reference clock signal edge is found:
        classifying the reference clock signal edge as lagging if the reference clock signal edge occurs within a first half of the period of the feedback clock signal, and
        classifying the reference clock signal edge as leading if the reference clock signal edge occurs within a second half of the period of the feedback clock signal.

2. The method of claim 1, further comprising:
    detecting no phase if a reference clock signal edge is not found within the period of the feedback clock signal.

3. The method of claim 1, further comprising:
    searching for a second reference clock signal edge with respect to a second period of the feedback clock signal.

4. The method of claim 3, further comprising:
    if both reference clock signal edges are classified as leading, rejecting the reference clock signal edge with the largest phase and applying a smaller phase to the loop.

5. The method of claim 3, further comprising:
    if both reference clock signal edges are classified as lagging, rejecting the reference clock signal edge with the largest phase and applying a smaller phase to the loop.

6. The method of claim 3, further comprising:
    if one reference clock signal edge is leading and one reference clock signal edge is lagging, applying a difference between the two signal edges to the loop.

7. A phase detector for use in a phase lock loop, the phase detector operable to phase lock the loop with minimal lock losses, the phase detector comprising circuitry to:
    search for a reference clock signal edge with respect to a period of a feedback clock signal;
    if a REFCLK signal edge is found:
        classify the reference clock signal edge as lagging if the reference clock signal edge occurs within a first half of the period of the feedback clock signal, and
        classify the reference clock signal edge as leading if the reference clock signal edge occurs within a second half of the period of the feedback clock signal; and
    generate an indicator of whether the reference clock signal edge is lagging or leading.

8. The phase detector of claim 7, wherein the circuitry is further to:
    detect no phase if a reference clock signal edge is not found within a second period of the feedback clock signal.

9. The phase detector of claim 7, wherein the circuitry is further to:
    search for a second reference clock signal edge with respect to a second period of the feedback clock signal.

10. The phase detector of claim 9, wherein the circuitry is further configured to:
    if both reference clock signal edges are classified as leading, rejecting the reference clock signal edge with a largest phase and applying a smaller phase to the loop.

11. The phase detector of claim 9, wherein the circuitry is further to:
    if both reference clock signal edges are classified as lagging, rejecting the reference clock signal edge with a largest phase and applying a smaller phase to the loop.

12. The phase detector of claim 9, wherein the circuitry is further to:
    if one reference clock signal edge is leading and one reference clock signal edge is lagging, applying a difference between the two reference clock signal edges to the loop.

13. A phase lock loop, comprising:
    a phase detector to receive a reference clock signal input and a feedback clock signal input and provide a phase signal as an output;
    a phase conditioner to receive the phase signal from the phase detector and to output a conditioned phase signal;
    a loop filter to receive the conditioned phase signal from the phase conditioner, filter out high-frequency components of the conditioned phase signal, and provide a filtered conditioned phase signal as an output;
    an oscillator to receive the filtered conditioned phase signal and to provide a final output clock signal with correct phase and frequency; and
    a divider to receive the clock signal and provide the feedback clock signal to the phase detector in a feedback configuration as a rational multiplier of the reference clock signal, and to output a count signal corresponding to a phase count;

wherein the phase detector is further to:
search for a reference clock signal edge with respect to a period of the feedback clock signal;
if a REFCLK signal edge is found:
classify the reference clock signal edge as lagging if the reference clock signal edge occurs within a first half of the period of the feedback clock signal, and
classify the reference clock signal edge as leading if the reference clock signal edge occurs within a second half of the period of the feedback clock signal.

14. The phase lock loop of claim 13, wherein the phase conditioner comprises circuitry to:
if the phase signal is greater than a threshold magnitude, reject the phase signal;
if the phase signal is substantially different from an average phase over a previous first number of cycles, reject the phase signal; and
if the average of the phase signal over a previous second number of cycles is greater than a threshold value, increase bandwidth.

15. The phase lock loop of claim 13, wherein the phase detector further comprises circuitry to:
provide zero for the phase signal if a reference clock signal edge is not found within the feedback clock period.

16. The phase lock loop of claim 13, wherein the phase detector further comprises circuitry to:
search for a second reference clock signal edge with respect to a second period of the feedback clock signal.

17. The phase lock loop of claim 16, wherein the phase detector further comprises circuitry to:
if both reference clock signal edges are classified as leading, reject the reference clock signal edge with a largest phase and apply a smaller phase to the phase signal.

18. The phase lock loop of claim 16, wherein the phase detector further comprises circuitry to:
if both reference clock signal edges are classified as lagging, reject the reference clock signal edge with a largest phase and apply a smaller phase to the phase signal.

19. The phase lock loop of claim 16, wherein the phase detector further comprises circuitry to:
if one reference clock signal edge is leading and one reference clock signal edge is lagging, applying the difference of the two reference clock signal edges to the phase signal.

20. A two-wire communication protocol device comprising the phase lock loop of claim 13.

21. The two-wire communication protocol device of claim 20, wherein the two-wire communication protocol device is a slave node on a two-wire bus.

22. The two-wire communication protocol device of claim 20, further comprising at least one low voltage differential signaling transceiver.

23. The two-wire communication protocol device of claim 20, further comprising an Inter-Integrated Circuit transceiver for communicating with one or more peripheral devices.

24. The phase lock loop of claim 13, wherein the loop filter is a digital loop filter.

25. The phase lock loop of claim 13, wherein the oscillator is a digitally controlled oscillator.

26. The phase lock loop of claim 13, wherein the phase conditioner is to, if a magnitude of the phase signal is greater than a threshold magnitude, reject the phase signal.

* * * * *